(12) United States Patent
Greene et al.

(10) Patent No.: US 9,773,885 B2
(45) Date of Patent: Sep. 26, 2017

(54) SELF ALIGNED GATE SHAPE PREVENTING VOID FORMATION

(71) Applicants: INTERNATIONAL BUSINESS MACHINES CORPORATION, Armonk, NY (US); GLOBALFOUNDRIES Inc., Grand Cayman (KY); STMicroelectronics, Inc., Coppell, TX (US)

(72) Inventors: Andrew M. Greene, Albany, NY (US); Qing Liu, Irvine, CA (US); Ruilong Xie, Niskayuna, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/471,733

(22) Filed: Mar. 28, 2017

(65) Prior Publication Data
US 2017/0200807 A1   Jul. 13, 2017

Related U.S. Application Data

(63) Continuation of application No. 14/974,589, filed on Dec. 18, 2015.

(51) Int. Cl.
*H01L 21/336* (2006.01)
*H01L 29/66* (2006.01)
(Continued)

(52) U.S. Cl.
CPC .. *H01L 29/66545* (2013.01); *H01L 21/30604* (2013.01); *H01L 21/76224* (2013.01);
(Continued)

(58) Field of Classification Search
CPC .................................................. H01L 29/66545
See application file for complete search history.

(56) References Cited

U.S. PATENT DOCUMENTS 7,977,181 B2   7/2011   Lai et al.
8,048,810 B2   11/2011  Tsai et al.
(Continued)

OTHER PUBLICATIONS

List of IBM Patents or Patent Applications Treated as Related dated Mar. 28, 2017, 2 pages.
(Continued)

*Primary Examiner* — Marvin Payen
(74) *Attorney, Agent, or Firm* — Tuntunjian & Bitetto, P.C.; Vazken Alexanian

(57) ABSTRACT

A semiconductor device that includes a first fin structure in a first portion of a substrate, and a second fin structure in a second portion of the substrate, wherein the first portion of the substrate is separated from the second portion of the substrate by at least one isolation region. A gate structure present extending from the first fin structure across the isolation region to the second fin structure. The gate structure including a first portion on the first fin structure including a first work function metal having at least one void, an isolation portion that is voidless present overlying the isolation region, and a second portion on the second fin structure including a second work function metal.

17 Claims, 9 Drawing Sheets

(51) Int. Cl.
*H01L 21/762* (2006.01)
*H01L 29/78* (2006.01)
*H01L 29/06* (2006.01)
*H01L 21/306* (2006.01)

(52) U.S. Cl.
CPC .... *H01L 29/0649* (2013.01); *H01L 29/66515* (2013.01); *H01L 29/66795* (2013.01); *H01L 29/785* (2013.01)

(56) References Cited

U.S. PATENT DOCUMENTS

| | | |
|---|---|---|
| 8,093,116 B2 | 1/2012 | Chung et al. |
| 8,513,127 B2 | 8/2013 | Chang et al. |
| 8,835,237 B2 | 9/2014 | Jagannathan et al. |
| 8,841,726 B2 | 9/2014 | Leobandung |
| 2013/0221413 A1 | 8/2013 | Jagannathan et al. |
| 2014/0145263 A1 | 5/2014 | Cheng et al. |
| 2015/0099340 A1 | 4/2015 | Yu et al. |

OTHER PUBLICATIONS

Huey, S. et al., "CMP process control for advanced CMOS device integration" ECS Transactions (2012) pp. 543-552, vol. 44, No. 1.
Economikos, L. et al., "Al CMP for Low Resistance Gate Fill for 20nm and Beyond Replacement Metal Gate" MRS Proceedings (2013) pp. 1-3, vol. 1560.

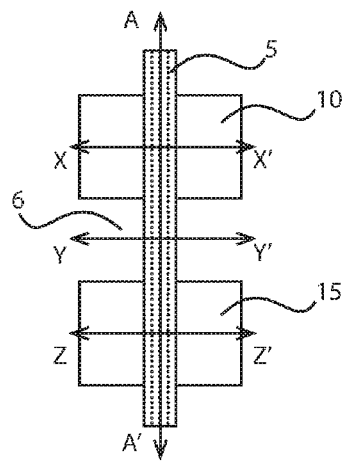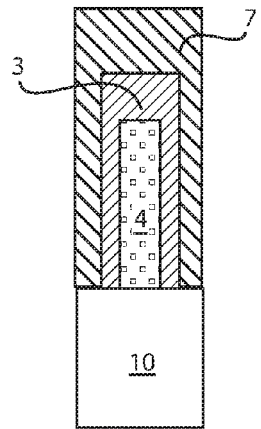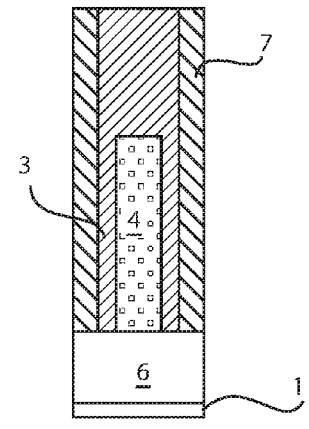
FIG. 1A   FIG. 1B   FIG. 1C
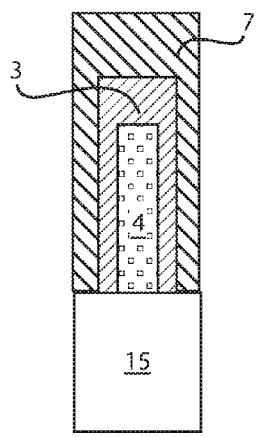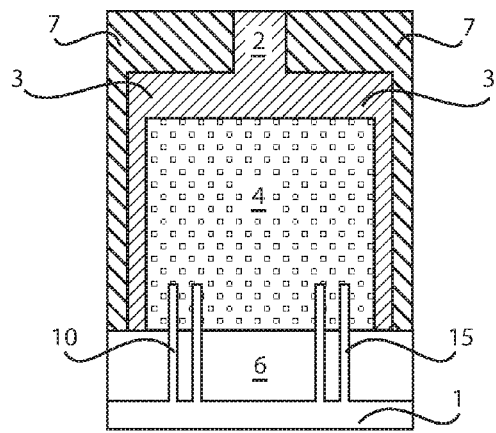
FIG. 1D   FIG. 1E

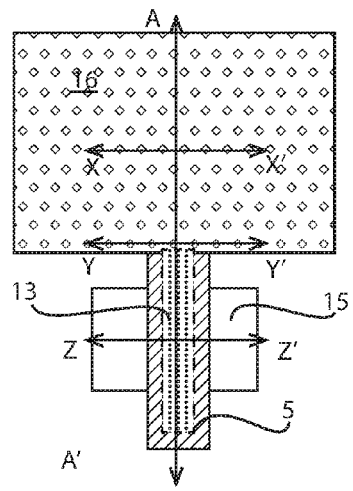
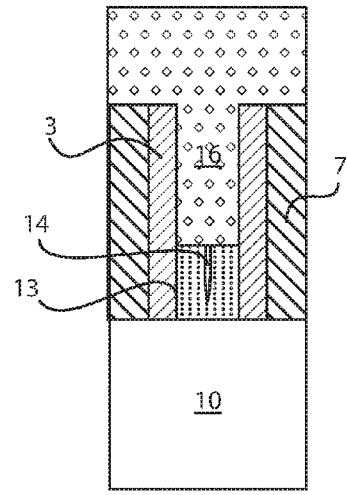
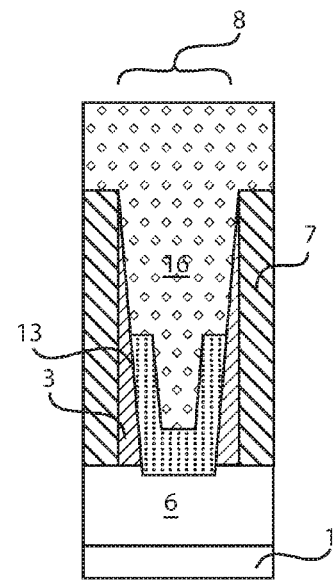
FIG. 6A    FIG. 6B    FIG. 6C
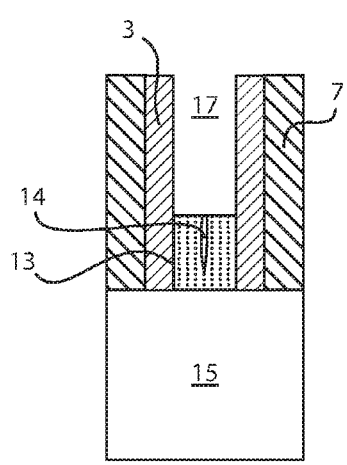
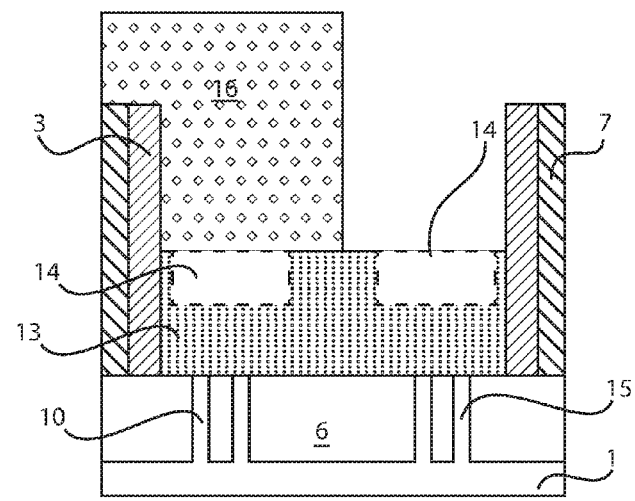
FIG. 6D    FIG. 6E

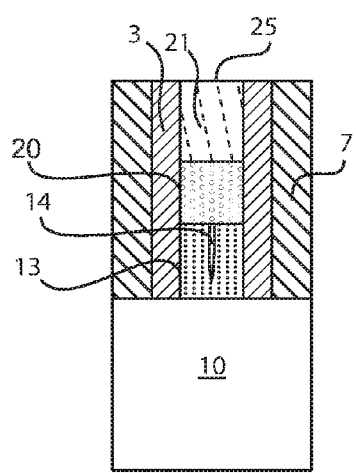
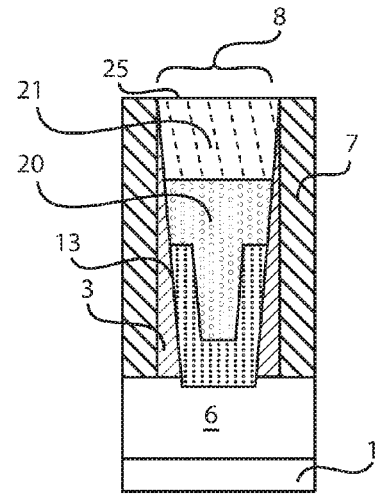
FIG. 9A
FIG. 9B
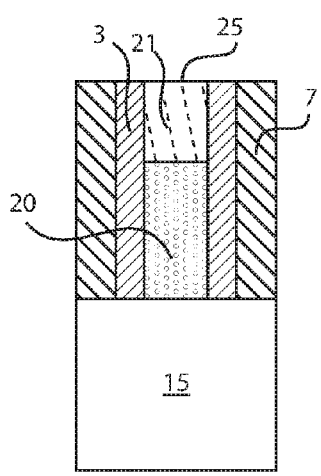
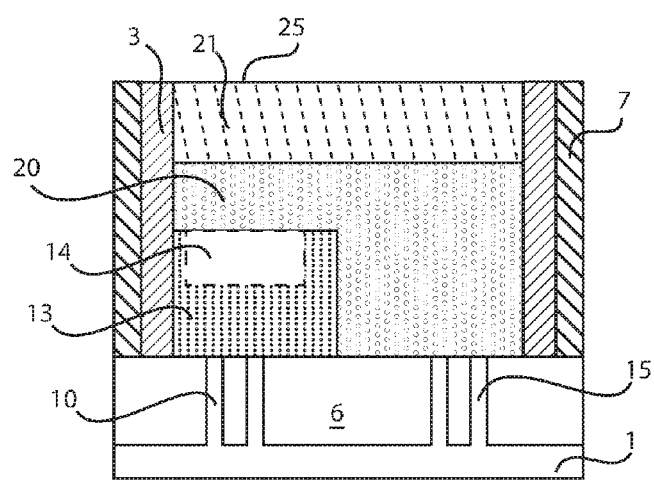
FIG. 9C
FIG. 9D

SELF ALIGNED GATE SHAPE PREVENTING VOID FORMATION

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming semiconductor devices is provided that includes forming a replacement gate structure in contact with a first device channel and a second device channel. The replacement gate structure includes a sacrificial gate conductor and a dielectric cap layer. The dielectric cap layer includes a bump portion between the first and second semiconductor device channel. The bump portion of the dielectric cap layer and the underlying portion of the sacrificial gate conductor are removed to provide an isolation gate opening having a first width between the first and second device channels. The portion of the replacement gate structure over the first and second device channels is removed to provide functional gate openings having a second gate width that is less than the first gate width. A first and second functional gate structure is formed in the functional gate openings to the first and second semiconductor device channels. A voidless dielectric material is present in the isolation gate opening that provides for process isolation between the first functional gate structure and the functional second gate structure.

In another embodiment, a method of forming a semiconductor device is provided that includes forming a replacement gate structure in contact with a first fin structure and a second fin structure that are present on a semiconductor substrate and separated by an isolation region. The replacement gate structure includes a sacrificial gate conductor and a dielectric cap layer. The dielectric cap layer includes a bump portion overlying the isolation region between the first and second fin structures. The bump portion of the dielectric cap layer is removed, as well as the underlying portion of the sacrificial gate conductor to provide an isolation gate opening having a first width between the first and second fin structures. A portion of the replacement gate structure that is present over the first and second fin structures may then be removed to provide functional gate openings having a second gate width that is less than the first gate width. A first and second functional gate structure is formed in the functional gate openings to the first and second fin structures, wherein a voidless dielectric material in the isolation gate opening provides for process isolation between the first functional gate structure and the functional second gate structure.

In another aspect of the present disclosure, a semiconductor device is provided. In one embodiment, a semiconductor device is provided that includes a first fin structure in a first portion of a substrate, and a second fin structure in a second portion of the substrate. The first portion of the substrate is separated from the second portion of the substrate by at least one isolation region. A gate structure is present extending from the first fin structure across the isolation region to the second fin structure. The gate structure includes a first portion on the first fin structure including a first work function metal having at least one void, an isolation portion that is voidless present on the portion of the gate structure that is overlying the isolation region, and a second portion on the second fin structure including a second work function metal.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 1A is a top down planar view of a semiconductor device including a replacement gate structure extending between a first and second fin structure, in accordance with one embodiment of the present disclosure.

FIG. 1B is a side cross-sectional view along section line XX' (hereafter referred to as across the gate structure portion over an n-type FinFET region) of the structure depicted in FIG. 1A.

FIG. 1C is a side cross-sectional view along section line YY' (hereafter referred to as across the gate structure portion over an isolation region) of the structure depicted in FIG. 1A.

FIG. 1D is a side cross-sectional view along section line ZZ' (hereafter referred to as across the gate structure portion over a p-type FinFET region) of the structure depicted in FIG. 1A.

FIG. 1E is a side cross-sectional view of the structure depicted in FIG. 1A along section line AA' (hereafter referred to as along the length of the gate structure) of the structure depicted in FIG. 1A.

FIG. 6A is a top down view depicting forming a block mask overlying the n-type FinFET region, the block mask filling at least the isolation gate opening providing a voidless dielectric material that provides for process isolation between the first functional gate structure being formed to the n-type FinFET and a second functional gate structure being formed to the p-type FinFET, in accordance with one embodiment of the present disclosure.

FIG. 6B is a side cross-sectional view.

FIG. 6C is a side cross-sectional view across the gate structure portion over an isolation region of the structure depicted in FIG. 6A.

FIG. 6D is a side cross-sectional view across the gate structure portion over the p-type FinFET region of the structure depicted in FIG. 6A.

FIG. 6E is a side cross-sectional view of the structure depicted in FIG. 6A along the length of the gate structure.

FIG. 9A is a side cross-sectional view depicting forming a second work function metal in at least the second functional gate opening to the p-type FinFET region, in accordance with one embodiment of the present disclosure.

FIG. 9B is a side cross-sectional view across the gate structure portion over an isolation region of the structure depicted in FIG. 9A.

FIG. 9C is a side cross-sectional view across the gate structure portion over the p-type FinFET region of the structure depicted in FIG. 9A.

FIG. 9D is a side cross-sectional view of the structure depicted in FIG. 9A along the length of the gate structure.

DETAILED DESCRIPTION

Figure 2A:
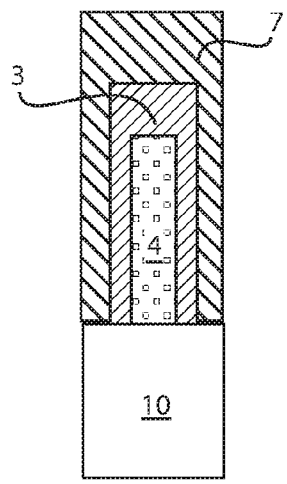
FIG. 2A is a side-cross sectional view across the gate structure portion over the n-type FinFET that depicts removing a bump portion of a dielectric cap layer that is present over a sacrificial gate conductor overlying the isolation region, in accordance with one embodiment of the present disclosure.
Figure 2B:
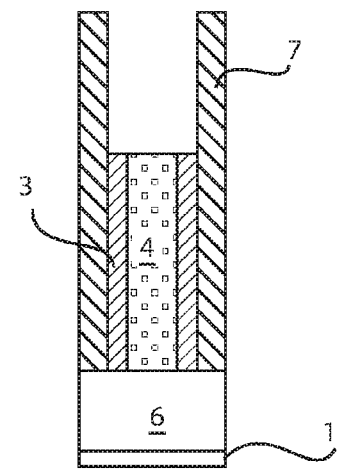
FIG. 2B is a side cross-sectional view across the gate structure portion over an isolation region of the structure depicted in FIG. 2A.
Figure 2C:
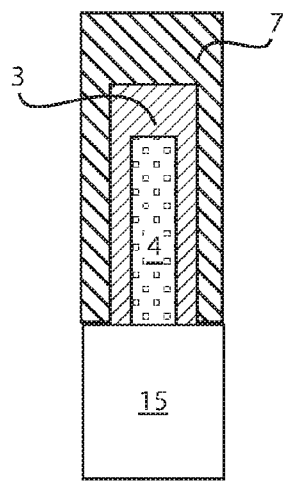
FIG. 2C is a side cross-sectional view across the gate structure portion over the p-type FinFET region of the structure depicted in FIG. 2A.
Figure 2D:
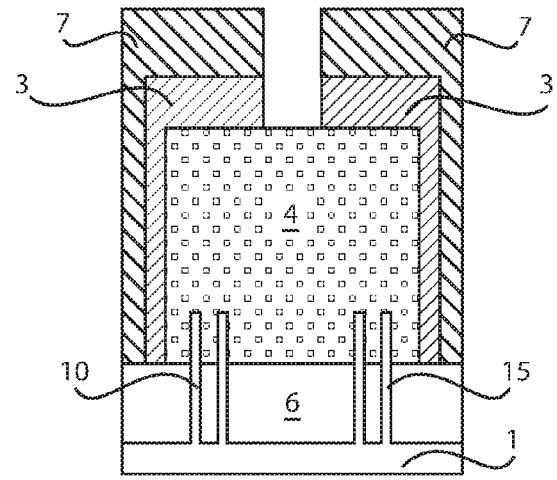
FIG. 2D is a side cross-sectional view of the structure depicted in FIG. 2A along the length of the gate structure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region.

As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

As the dimensions of semiconductor devices continue to scale it has been determined that is becoming more and more difficult to fill trenches and openings with deposited materials. For example, as the technology has decreased to, e.g., the 10 nm and 7 nm node technology, the gate length for some semiconductor devices is too small, such that a void is formed in the metal layers of gate structures (including replacement gate structure) or a void is formed under deposited dielectric materials overlying gate structures (including replacement gate structures) during replacement metal gate process, such as the replacement metal gate processing that is used to form multiple Fin type Field Effect Transistors (FinFETs) on the same semiconductor substrate. More specifically, when depositing metal containing layers for the gate conductor or a work function adjusting layer within the gate structure, if the deposited metal containing layers are being formed in a trench with a width that is two small, a portion of the deposited metal containing layer that is above the base of the trench may pinch off enclosing a void between the portion of the metal containing layer that is deposited at the base of the trench and the portion of the metal containing layer extending from the base of the trench along a sidewall of the trench. In another example, when depositing metal containing layers for the gate conductor or a work function adjusting layer within the gate structure, if the deposited metal containing layers are being formed in a trench with a width that is two small, a metal layer will have a space between the portions of the metal layer that are deposited on the opposing sidewalls of the trench and the portion of the metal layer on the base of the trench that is too small to be filled by a subsequently deposited dielectric. In this example, when a dielectric layer is deposited in the trench atop the metal layer, the dielectric layer caps off the space providing a void within the trench. The formation of these voids can be problematic when forming gate structures that extend between two different types of semiconductor devices. For example, the voids can function as the passageways (also referred to as a subway) from one of the devices to the other that can transmit the processing chemicals between the two devices. This can negatively impact device isolation during processing. For example, even if a block mask is formed over one of the devices during an etch process, the voids in the gate structure shared by the two devices can provide a passageway to transmit etch chemistry gasses and liquids to the device that is covered by the etch mask, which can damage the device that is intended to be protected by the overlying block mask.

In some embodiments, the methods and structures disclosed herein can provide for greater isolation between devices sharing a same gate structure during a replacement gate process by eliminating the formation of voids in the gate structure between the devices that share the gate structure. For example, a process may be employed to increase the width of the portion of the trench, i.e., gate structure opening, that is produced by removing the sacrificial gate conductor as part of a replacement gate process that is over the isolation region separating the two regions of the substrate in which the field effect transistors (FETs) are formed. By increasing the width of the trench for housing the gate structure that is present overlying the isolation region portion of the substrate, the methods and structures of the present disclosure ensure that the portion of the gate structure formed over the isolation region will be free of voids. By providing a void free gate structure over the isolation region, the present disclosure substantially eliminates the formation of a passageway through the gate structure that can transmit processing chemicals from one region of a substrate to another. The methods and structures of the present disclosure are now discussed with more detail referring to FIGS. 1A-9D.

FIGS. 1A-1E depict one embodiment of forming a replacement gate structure 5 in contact with a first device channel 10 and a second device channel 15, wherein the replacement gate structure 5 includes a sacrificial gate conductor 4 and a dielectric cap layer 3 that includes a bump portion 2 between the first and second semiconductor device channels 10, 15. In the supplied figures, the first device channel 10 and the second device channel 15 are provided by fin structures. Therefore, the first device channel 10 is hereafter referred to as a first fin structure 10 and the second device channel 15 is referred to as a second fin structure 15. It is noted that fin structures are only one example of a semiconductor geometry that can provide the first and second device channel, and that the present disclosure is not only limited to this example. For example, the first and second device channels 10 may be provided by semiconductor material regions for a planar semiconductor device. The first and second fin structures 10, 15 may be present on a dielectric surface 6 that provides for isolation from one another.

The first and second fin structures 10, 15 may be formed from a semiconductor substrate 1. In some embodiments, the first and second fin structures 10, 15 may be formed from a semiconductor on insulator (SOI) substrate or a bulk semiconductor substrate. The semiconductor material of the semiconductor substrate 1 that provides the first and second fin structures 10, 15 may be a silicon including material. In some embodiments, the silicon including material that provides the semiconductor substrate 1 may include, but is not limited to silicon, single crystal silicon, multicrystalline silicon, polycrystalline silicon, amorphous silicon, strained silicon, silicon doped with carbon (Si:C), silicon alloys or any combination thereof. In one example, the silicon including semiconductor substrate 1 composed of greater than 99 at. % silicon (Si), e.g, 100 at. % silicon (Si). In some embodiments, the methods and structures disclosed herein may be applied to other semiconductor materials besides silicon, such as other type IV semiconductors, and compound semiconductors, like type III-V semiconductor materials.

The first and second fin structures 10, 15 may be formed from the semiconductor substrate 1, e.g., SOI substrate, using photolithography and etch processes. In one embodiment, the patterning process used to define each of the first and second fin structures 10, 15 is a sidewall image transfer (SIT) process. The SIT process can include forming a mandrel material layer (not shown) on the material layer that provides the first and second fin structures 10, 15 such as the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the first and second fin structures 10, 15.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD); plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each of the first and second fin structures 10, 15.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material that provides the first and second fin structures 10, 15. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the first and second fin structures 10, 15. Following etching, i.e., pattern transfer, the SIT process may conclude with removing the dielectric spacers using an etch process or a planarization process.

Each of the first and second fin structures 10, 15 may have a height ranging from 5 nm to 200 nm. In another embodiment, each of the first and second fin structures 10, 15 may have a height ranging from 10 nm to 100 nm. In one example, each of the first and second fin structures 10, 15 may have a height ranging from 20 nm to 50 nm. Each of the fin structures 10, 15 may have a width of less than 20 nm. In another embodiment, the fin structures 5 have a width ranging from 3 nm to 8 nm.

Still referring to FIGS. 1A-1E, an isolation region 6 may be formed between adjacent fin structures 10, 15 on a surface of the substrate 1. The isolation region 6 may be composed of a dielectric material, such as an oxide, e.g., silicon oxide, a nitride, such as silicon nitride, or an oxynitride, such as silicon oxynitride. The isolation regions 25 may be formed using deposition and etch recess processing. For example, the dielectric material for the isolation region 6 may be deposited using a variation of chemical vapor deposition, such as plasma enhanced chemical vapor deposition (PECVD) or metal organic chemical vapor deposition (MOCVD). The etch recess process may be an anisotropic etch, such as reactive ion etching (RIE).

The sacrificial gate structure 5 may be formed contacting the channel region of the fin structures 10, 15. In a replacement gate process, a sacrificial gate structure 5 is first formed on a channel region of the semiconductor device, wherein the sacrificial gate structure dictates the size and geometry of a later formed functional gate structure. By "sacrificial" it is meant that the structure is present during processing of the semiconductor device, but is removed from the semiconductor device prior to the device being completed. The "functional gate structure" operates to switch the semiconductor device from an "on" to "off" state, and vice versa.

In one embodiment, the sacrificial material that provides the sacrificial gate structure 5 may be composed of any material that can be etched selectively to the fin structures 10, 15. In some embodiments, the sacrificial gate structure 5 may include a sacrificial gate electrode 4 and a dielectric cap layer 3. The layered structure of the sacrificial gate electrode 4 and the dielectric cap layer may 3 be employed to facilitate selective deposition and selective etch process that are employed in later stages of the process flow for forming the semiconductor device. In one embodiment, the sacrificial gate electrode 4 of the sacrificial gate structure 5 may be composed of a silicon-including material, such as polysilicon. In one embodiment, the gate dielectric cap layer 3 may be composed of a dielectric material, such as an oxide, nitride or oxynitride material, or amorphous carbon.

The sacrificial gate electrode 4 may be formed using deposition (e.g., chemical vapor deposition) photolithography and etch processes (e.g., reactive ion etching) to provide the sacrificial gate structure 5. The gate dielectric cap layer 3 may be formed on the upper (hard mask dielectric) and sidewall surfaces (sidewall spacers) of the sacrificial gate electrode 4. The gate dielectric cap layer 3 is typically composed of a dielectric material, such as an oxide, e.g., silicon oxide, a nitride, such as silicon nitride, or an oxynitride, such as silicon oxynitride. The gate dielectric cap layer 3 may be formed using deposition and etch back processing. For example, the dielectric material for the gate dielectric cap layer 3 may be deposited using a variation of chemical vapor deposition, such as plasma enhanced chemical vapor deposition (PECVD) or metal organic chemical vapor deposition (MOCVD). The etch back process may be an anisotropic etch, such as reactive ion etching (RIE).

The gate dielectric cap layer 3 typically includes a bump portion 2 that is present on an upper surface of the portion of the sacrificial gate electrode 4 that is present over the isolation region 6. The bump portion 2 has a greater thickness than the remainder of the gate dialectic cap layer 3 that is present over the first fin structure 10 and the second fin structure 15. The bump portion 2 typically results from the separate spacer patterning overlap, spacer deposition and etch back on NFET vs. PFET devices, etch mask processing and/or block mask processing that is used to separately process the region of the substrate 1 including the first fin structure 10 from the region of the substrate 1 including the second fin structure 15. The overlap of sidewall spacer deposition on NFET and PFET is required and results in the bump over STI regions.

Although not depicted in the supplied figures, the first fin structure 10 typically includes source and drain regions having an n-type conductivity, and the second fin structure 15 typically includes source and drain regions having a p-type conductivity. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on. The conductivity type of the source regions and the drain regions dictates the conductivity type of the semiconductor device. The term "conductivity type" refers to whether the device is n-type or p-type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

The source and drain regions are typically formed on the source and drain region portions of the fin structures that are present on opposing sides of the channel portion of the fin structure that the gate structure is present on. The source and drain regions typically include an epitaxial semiconductor material that is formed on the source and drain region portions of the fin structure. The epitaxial semiconductor material for the source and drain regions may be a type IV semiconductor, such as silicon (Si), silicon germanium (SiGe), germanium (Ge), silicon doped with carbon (Si:C). The epitaxial semiconductor material may be doped to the conductivity type of the source and drain region. For example, if the semiconductor device is an n-type FinFET, the epitaxial semiconductor material that is present on the source and drain region portions of the fin structure is doped to an n-type conductivity; and if the semiconductor device is a p-type FinFET, the epitaxial semiconductor material that is present on the source and drain region portions of the fin structure is doped to a p-type conductivity.

Referring to FIGS. 1A-1E, following formation of the source and drain regions, an interlevel dielectric layer 7 may be deposited and planarized so that the upper surface of the interlevel dielectric layer 7 is coplanar with an upper surface of the bumper portion 2 of the dialectic cap layer 3.

The interlayer dielectric 7 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlayer dielectric layer include any of the aforementioned materials in porous form, or in a form that changes during processing to or from being porous and/or permeable to being non-porous and/or non-permeable. The interlayer dielectric layer 7 may be planarized using chemical mechanical planarization to provide an upper surface that is coplanar with the upper surface of the bump portion 2 the dialectic cap layer 3 that is present over the isolation region 6.

FIGS. 2A-2D depict removing the bump portion 2 of a dielectric cap layer 3 that is present over a sacrificial gate conductor 4 overlying the isolation region 6. In one embodiment, the bump portion 2 is removed by an etch process. In some embodiments, the etch process for removing the bump portion 2 is anisotropic. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiment, the etch process for removing the bump portion 2 may be a selective etch process. The term "selective" as used to describe a material removal process denotes that the rate of material removal for a first material is greater than the rate of removal for at least another material of the structure to which the material removal process is being applied. In some embodiments, the etch process for removing the bump portion 2 of the dielectric cap layer 3 may be selective to the interlayer dielectric layer 7. In some embodiments, the etch process for removing the bump portion 2 of the dielectric cap layer 3 may be selective to the sacrificial gate conductor 4. The etch process may be a timed etch, or terminated using end point detection.

Figure 3A:
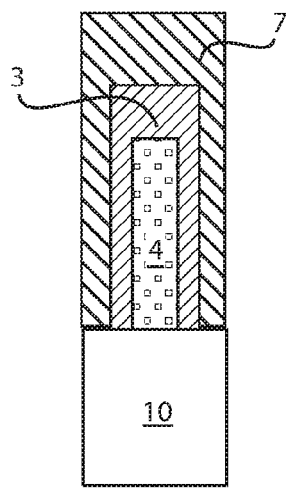
FIG. 3A is a side-cross sectional view across the gate structure portion over the n-type FinFET that depicts removing the portion of the sacrificial gate structure that is present over the isolation region to provide an isolation gate opening, in accordance with one embodiment of the present disclosure.
Figure 3B:
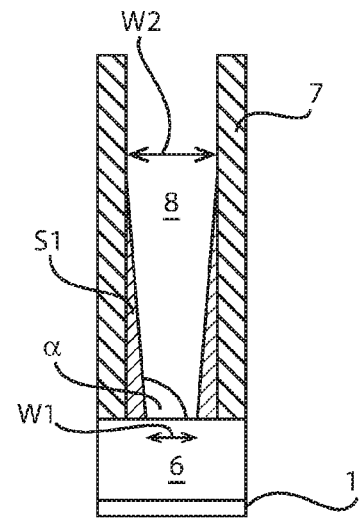
FIG. 3B is a side cross-sectional view across the gate structure portion over an isolation region of the structure depicted in FIG. 3A.
Figure 3C:
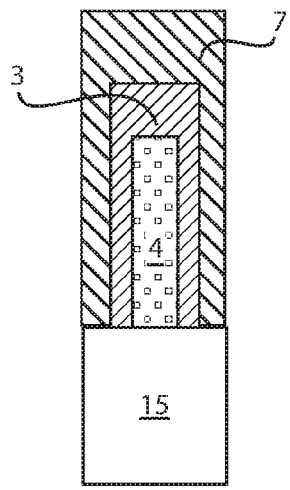
FIG. 3C is a side cross-sectional view across the gate structure portion over the p-type FinFET region of the structure depicted in FIG. 3A.
Figure 3D:
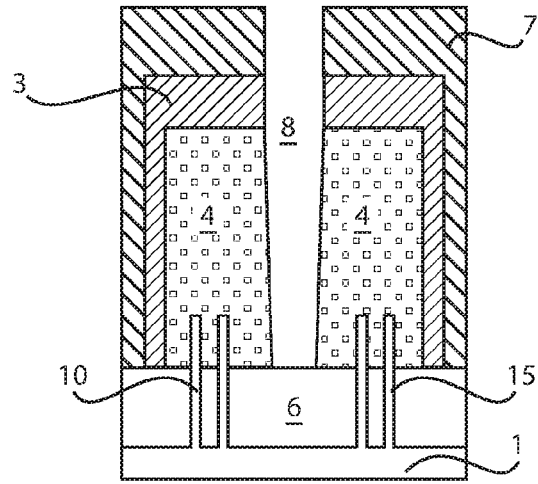
FIG. 3D is a side cross-sectional view of the structure depicted in FIG. 3A along the length of the gate structure.
Figure 4A:
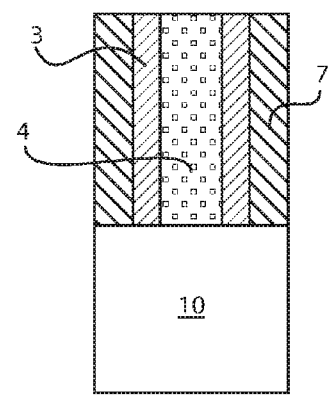
FIG. 4A is a side-cross sectional view across the gate structure portion over the n-type FinFET that depicts forming an amorphous semiconductor material in the isolation gate opening, in accordance with one embodiment of the present disclosure.
Figure 4B:
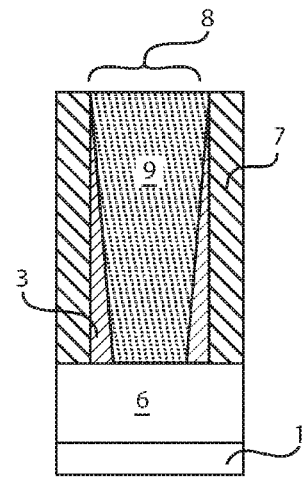
FIG. 4B is a side cross-sectional view across the gate structure portion over an isolation region of the structure depicted in FIG. 4A.
Figure 4C:
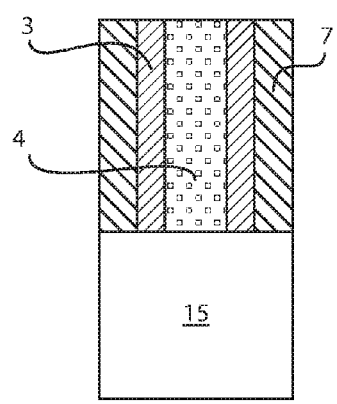
FIG. 4C is a side cross-sectional view across the gate structure portion over the p-type FinFET region of the structure depicted in FIG. 4A.
Figure 4D:
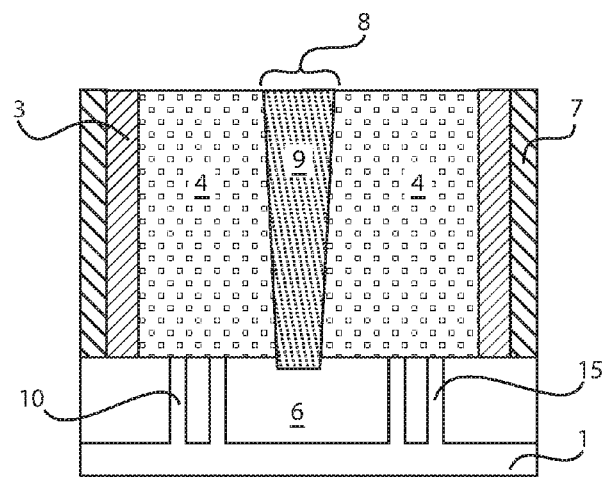
FIG. 4D is a side cross-sectional view of the structure depicted in FIG. 4A along the length of the gate structure.

FIG. 3A-3D depict removing the portion of the sacrificial gate structure 4 that is present over the isolation region 6 to provide an isolation gate opening 8. In some embodiments, the surface of the sacrificial gate structure 4 that is exposed by removing the bump portion 2 of the dielectric cap layer 3, which is present over the isolation region 6, is etched using an etch process. The etch process for etching the exposed portion of the sacrificial gate structure 4 having at least one of an etch selectivity and etch directionality that is selected to remove a portion of the sacrificial gate structure 4 and sidewall portions of the dialectic cap layer 3 in a manner that provides an isolation gate opening 8 having a tapered width W1, W2, as depicted in FIG. 3B. More specifically, the upper opening width W2 of the isolation gate opening 8 is greater than the base opening width W1 of the isolation gate opening 8. The width dimensions W1, W2 of the isolation gate opening 8 are parallel to the channel length, i.e., the dimension separating the source and drain regions of the n-type FinFET and the p-type FinFET. The taper of the isolation gate opening 8 is provided by removing a greater amount of material from the vertically orientated portions of the dielectric cap layer 3 that is present on the sidewalls of the sacrificial gate conductor 4 from the upper portion of the isolation gate opening 8 than the lower portion of the isolation gate opening 8. The inside sidewall S1 of the remaining portion of the dielectric cap layer 3 forms an obtuse angle α with the upper surface of the isolation region 6 at the base of the isolation gate opening 6.

In some embodiments, the upper width W2 of the isolation gate opening 8 may range from 10 nm to 50 nm, and the lower width W1 of the isolation gate opening 8 may range from 5 nm to 20 nm. In another embodiment, the upper width W2 of the isolation gate opening 8 may range from 15 nm to 30 nm, and the lower width W1 of the isolation gate opening 8 may range from 5 nm to 15 nm. The obtuse angle α formed by the intersection of the inside sidewall S1 of the dielectric cap layer 3 and the upper surface of the isolation region 6 may range from 91° to 120°. In another embodiment, the obtuse angle α formed by the intersection of the inside sidewall S1 of the dielectric cap layer 3 and the upper surface of the isolation region 6 may range from 95° to 115°. In one example, the bottom of the isolation gate opening 8 has a width W1 ranging from 15 nm to 20 nm and the upper width W2 ranges from 17 nm to 22 nm for 7 nm technology. Typically, the methods and structures disclosure would like to increase the top width W2 at least ~3-5 nm as compared to the bottom width W1.

The etch process used to remove the exposed portion of the sacrificial gate conductor 4 and to taper etch the inside sidewalls S1 of the vertically oriented portions of the dielectric cap layer 3 may include plasma etching, wet chemical etching, or reactive ion etching.

FIGS. 4A-4D depict one embodiment of forming a semiconductor material 9 in the isolation gate opening 8. For example, the semiconductor material may fill the entirety of the isolation gate opening 8, and be planarized to have an upper surface that is coplanar with at least the upper surface of the interlevel dielectric layer 7. The semiconductor material may be a silicon containing material, and in some instances should be the same Si as the remaining dummy gate silicon. For example, the semiconductor material 9 may be amorphous silicon. The semiconductor material 9 may be deposited using a chemical vapor deposition process, such as plasma enhanced chemical vapor deposition (PECVD). Following deposition, the upper surface of the semiconductor material 9 may be planarized using chemical mechanical planarization. In some embodiments, the planarization process may continue until the upper surfaces of the portions of the sacrificial gate conductor 4 that are present over the n-type fin structure 10 and the p-type fin structure 15 are exposed, and are therefore coplanar with the upper surface of the semiconductor material 9 that is present in the isolation gate opening 8.

Figure 5A:
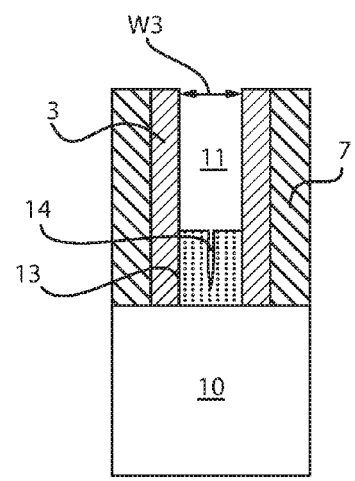
FIG. 5A is a side-cross sectional view across the gate structure portion over the n-type FinFET that depicts removing the sacrificial gate conductors from the replacement gate structures to the n-type FinFET region and the p-type FinFET region, as well as removing the amorphous semiconductor from the isolation gate opening, and forming a first work function metal in the isolation gate opening, the first functional gate opening and the second functional gate opening, in accordance with one embodiment of the present disclosure.
Figure 5B:
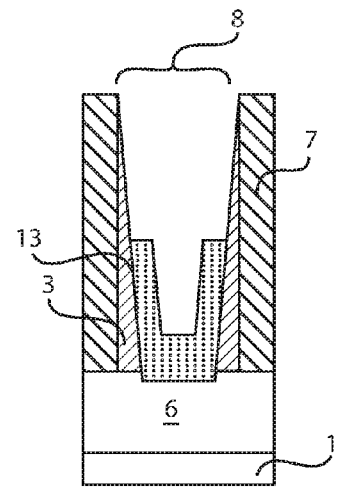
FIG. 5B is a side cross-sectional view across the gate structure portion over an isolation region of the structure depicted in FIG. 5A.
Figure 5C:
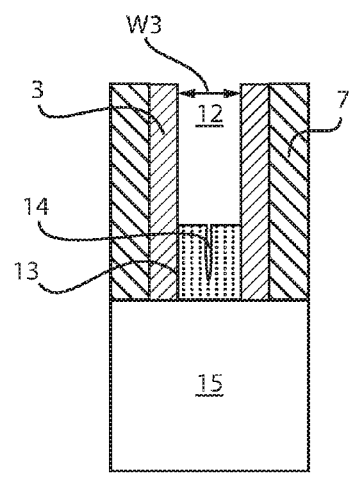
FIG. 5C is a side cross-sectional view across the gate structure portion over the p-type FinFET region of the structure depicted in FIG. 5A.
Figure 5D:
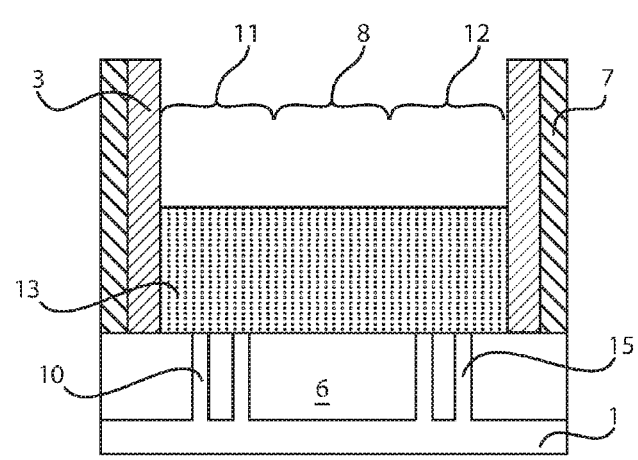
FIG. 5D is a side cross-sectional view of the structure depicted in FIG. 5A along the length of the gate structure.

FIGS. 5A-5D depict removing the sacrificial gate conductor 4 from the portions of the replacement gate structure to the n-type FinFET region and the p-type FinFET region, as well as removing the semiconductor material 9 from the isolation gate opening 8. In some embodiments, the remaining portions of the sacrificial gate conductor 4 and the semiconductor material 9 are removed using an etch that is selective to at least the n-type fin structure 10 and the p-type fin structure 15, which are covered with a protective oxide layer. Removing the portion of the sacrificial gate conductor 4 from over the n-type fin structure 10 provides a first functional gate opening 11, and removing the sacrificial gate conductor 4 from over the p-type fin structure 15 provides a second functional gate opening 12. It is noted that the first functional gate opening 11, the isolation gate opening 8, and the second functional gate opening 12 are contiguous providing a continuous opening as depicted in FIG. 5D. The etch process may include plasma etching, reactive ion etching or wet chemical etching. The first functional gate opening 11 and the second function gate opening 12 each have a width W3 that is not tapered, i.e., the width at the top of the opening is substantially the same as the width W3 at the base of the opening. The width W3 of each of the first and second functional gate opening 11, 12 is typically less than the width W2 of the isolation gate opening 8. For example, the width W3 of each of the first and second functional gate opening 11, 12 may range from 5 nm to 30 nm. In another example, the width W3 of each of the first and second functional gate opening 11, 12 may range from 5 nm to 15 nm.

FIGS. 5A-5D also depict forming a first work function metal 13 in the isolation gate opening 8, the first functional gate opening 11 and the second functional gate opening 12. In some embodiments, before depositing the first work function metal layer 13, at least one gate dielectric layer (not shown) is formed on at least the channel region portions of the n-type fin structure 10 and the p-type fin structure 15.

Also, in some embodiments, the dummy protective oxide layer on the fins is removed selectively to the channel using a COR (chemical oxide removal dry etch) and cleaned with DHF prior to high-k deposition. The at least one gate dielectric layer is typically positioned directly on at least the channel portion of the n-type fin structure 10 and the p-type fin structure 15. The at least one gate dielectric layer may also be formed by a deposition process, such as, e.g., CVD, plasma-assisted CVD, MOCVD, ALD, evaporation, reactive sputtering, chemical solution deposition and other like deposition processes. The at least one gate dielectric layer may also be formed utilizing any combination of the above processes.

The at least one gate dielectric layer may be comprised of an insulating material having a dielectric constant of about 4.0 or greater. In another embodiment, the at least one gate dielectric layer is comprised of an insulating material having a dielectric constant greater than 7.0. The dielectric constants mentioned herein are relative to a vacuum at room temperature, e.g., 25° C. In one embodiment, the at least one gate dielectric layer employed in the present disclosure includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm. The at least one gate dielectric layer may be deposited continuously over the channel region of the n-type fin structure 10 in the first functional gate opening 11, over the isolation region 6 in the isolation gate opening 8, and over the channel region of the p-type fin structure 15 in the second functional gate opening 12.

Following the formation of the at least one gate dielectric layer, the first work function metal layer 13 may be deposited. The first work function metal layer 13 may be deposited continuously onto the at least one gate dielectric layer over the channel region of the n-type fin structure 10 in the first functional gate opening 11, over the isolation region 6 in the isolation gate opening 8, and over the channel region of the p-type fin structure 15 in the second functional gate opening 12. The first work function metal 13 is typically removed from the p-type fin structure 15 in subsequent processing, and remains on the n-type fin structure 10. Therefore, the first work function metal 13 is typically composed of metal having a composition that provides an n-type work function metal layer. An "n-type work function metal layer" is a metal layer that effectuates an n-type threshold voltage shift. In one embodiment, the work function of the n-type work function metal layer ranges from 4.1 eV to 4.3 eV. In some embodiments, the n-type work function metal layer is composed of at least one of TiAl, TanN, TiN, HfN, HfSi, TiC or combinations thereof.

The first work function metal 13 may be formed by using a deposition method, such as a chemical vapor deposition method and/or a physical vapor deposition (PVD). For example, when the first work functional metal 13 is deposited using a PVD method, the method employed may include plating, electroplating, plating, sputter, and a combination thereof. For example, when the first work function metal 13 is deposited using chemical vapor deposition (CVD), the first work function metal 13 may be deposited using atomic layer deposition (ALD), plasma enhanced chemical vapor deposition (PECVD), metal organic chemical vapor deposition (MOCVD) and a combination thereof.

Referring to FIGS. 5A and 5C, the narrower width W3 of the first functional gate opening 11 and the second functional gate opening 12 causes a void 14 to be formed in the portion of the first work function metal 13 deposited therein. In some instances, due to dummy gate etching variability and top/bottom CD drift, the dummy gate taper angle (W1-W2) can be positive and naturally cause a void during work function metal (WFM) deposition. The void 14 is a space that is encapsulated by the first work function metal layer 13 as it is being deposited, in which a portion of the first work function metal layer 13 that is above the base of the first functional gate opening 11 and the second functional gate opening 12 may pinch off enclosing the void 14 between the portion of the first work function metal layer 13 that is deposited at the base of the first and second functional gate openings 11, 12 and the portion of the first work function metal layer 13 extending from the base of the first and second functional gate openings 11, 12 along a sidewall of the first and second functional gate openings 11, 12. In other examples, because the width of the first and second functional gate openings 11, 12 is too small, the deposited first work function metal layer 13 forming in those openings will have a space between the portions of the first work function metal layer 13 that are deposited on the opposing sidewalls of the first and second functional gate openings 11, 12 is too small to be filled by a subsequently deposited dielectric. In this example, depositing a dielectric atop first work function metal layer 13 in the first and second functional gate openings 11, 12 encapsulates this space forming a void 14. If the voids 14 present in the first and second functional gate openings 11, 12 extended across the isolation region, a passageway could be formed (also called a subway) that would allow for—process chemicals used for forming an n-type FinFET using the n-type fin structure 10 to be transmitted to the p-type fin structure 15, and vice versa.

In comparison to the portion of the first work function metal layer 13 that is formed in the first and second functional gate openings 11, 12, the portion of the first work function metal layer 13 that is formed in the isolation gate opening 8 is conformally deposited on the tapered inner sidewalls of the remaining portion of the dielectric cap layer 3, and the base of the isolation gate opening 8 without resulting in a pinch off region or a region having a width that is too narrow to be filled with a subsequently deposited dielectric layer. The reason for the conformal deposition of the first work function metal layer 13 within the isolation gate opening 8 is the wider width W2 of the isolation gate opening 8 in combination with the tapered sidewalls S1 of the remaining portion of the dielectric cap layer 3.

FIGS. 6A-6E depict forming a block mask 16 overlying the n-type FinFET region including the first functional gate opening 11 to the n-type fin structure 10 and the isolation gate opening 8 over the isolation region 6, the block mask 16 filling at least the isolation gate opening 8 providing a voidless dielectric material that provides for process isolation between the first functional gate structure 11 being formed to the n-type fin structure 10 and a second functional gate structure 12 being formed to the p-type fin structure 15. The block mask 16 does not cover the second functional gate opening 11 to the p-type fin structure 15 leaving it exposed.

The block mask 16 may be composed of an organic planarization layer (OPL). The organic planarization layer can include a photo-sensitive organic polymer comprising a light-sensitive material that, when exposed to electromagnetic (EM) radiation is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the organic planarization layer (OPL) may comprise any organic polymer and a photo-active compound having a molecular structure that can attach to the molecular structure of the organic polymer. In some embodiments, the OPL is just an organic bottom planarization layer, and there is a separate photosensitive resist layer on top, between these two layers is an anti-reflective coating layer. In other embodiments, the block mask 16 may be a nitride, such as silicon nitride, oxide, such as silicon oxide, or a silicon oxynitride. Any material that is suitable for selective etching relative to the first work function metal layer 13 may also be employed for the block mask 16. The block mask 16 may be deposited using spin on deposition, chemical vapor deposition (CVD), such as plasma enhanced CVD (PECVD) or metal organic chemical vapor deposition (MOCVD). In the embodiments, in which the block mask 16 is an OPL layer, the OPL layer may be a photo reactive photoresist. In these embodiments, the OPL layer may be patterned using photolithography and development processes. In some embodiments, the resist layer is completed using this process, and the pattern is then transferred into the OPL using a dry etch chemistry ($N_2/H_2$ or $O_2$). In the embodiment, in which the block mask 16 is a hard mask material, the block mask 16 may be formed by depositing the hard mask material for block mask using, e.g., chemical vapor deposition; forming an etch mask, e.g., photoresist mask, on the deposited hard mask material; and etching the hard mask material using the photoresist mask to define the geometry of the block mask 16.

Referring to FIG. 6B, the void 14 is clearly depicted as being further encapsulate by the block mask 16 that is formed thereon. Referring to FIG. 6C, the entirety of the gate isolation opening 8 that extends to the isolation region 6, which is present between the n-type fin structure 10 and the p-type fin structure 15 is filled with the combination of the first work function metal 13 and the block mask 16. This provides for enhanced isolation between the n-type FinFET region of the substrate including the n-type fin structure 10 and the p-type region of the substrate including the p-type fin structure 15 by eliminating the possibility of a void, such as the void 14 depicted in FIG. 6B, extending from the gate structure overlying the n-type fin structure 10 across the isolation region 6 to extend over the p-type fin structure 15.

Figure 7A:
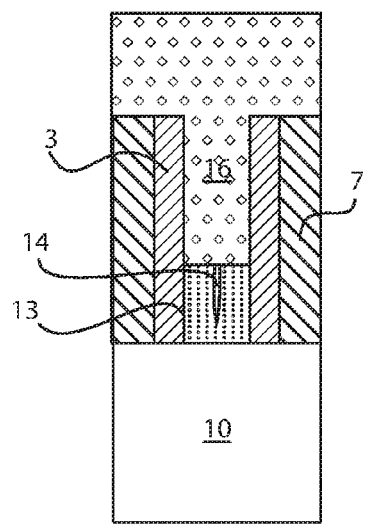
FIG. 7A is a side cross-sectional view depicting removing at least the first work function metal from the second functional gate opening to the p-type FinFET region, in accordance with one embodiment of the present disclosure.
Figure 7B:
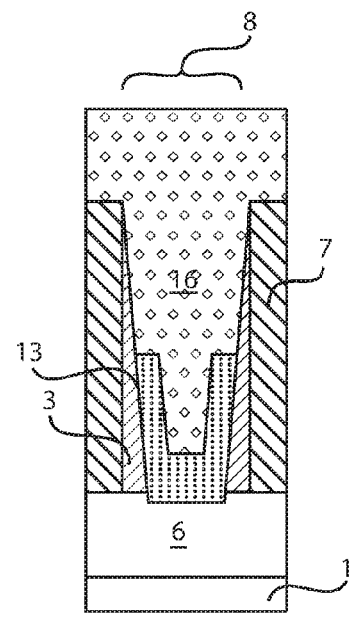
FIG. 7B is a side cross-sectional view across the gate structure portion over an isolation region of the structure depicted in FIG. 7A.
Figure 7C:
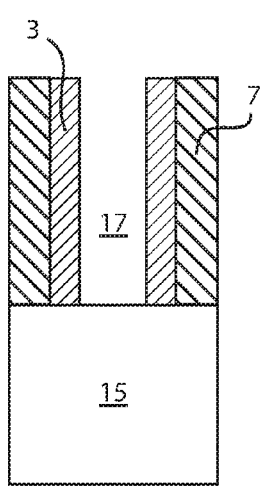
FIG. 7C is a side cross-sectional view across the gate structure portion over the p-type FinFET region of the structure depicted in FIG. 7A.
Figure 7D:
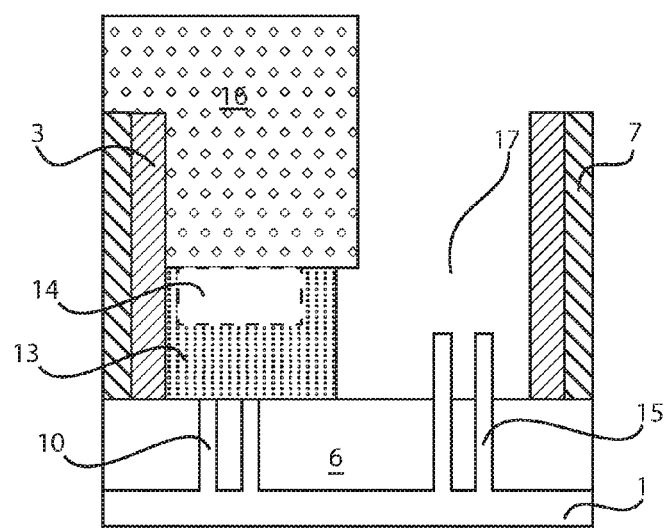
FIG. 7D is a side cross-sectional view of the structure depicted in FIG. 7A along the length of the gate structure.
Figure 8A:
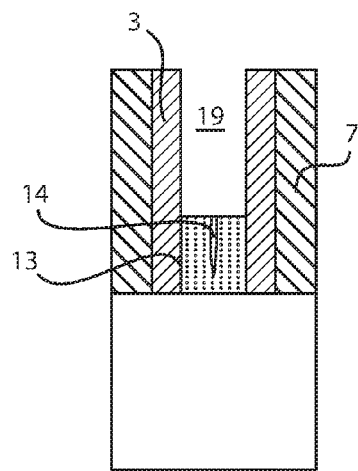
FIG. 8A is a side cross-sectional view depicting removing the first block mask, in accordance with one embodiment of the present disclosure.
Figure 8B:
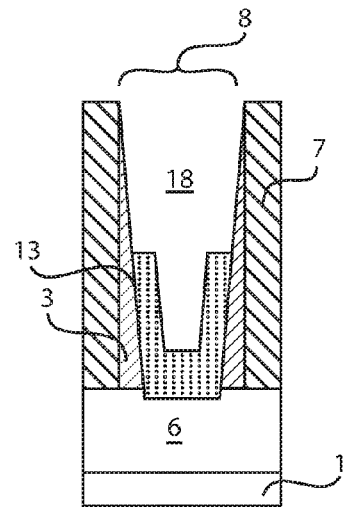
FIG. 8B is a side cross-sectional view across the gate structure portion over an isolation region of the structure depicted in FIG. 8A.
Figure 8C:
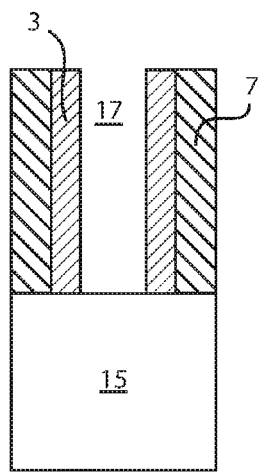
FIG. 8C is a side cross-sectional view across the gate structure portion over the p-type FinFET region of the structure depicted in FIG. 8A.
Figure 8D:
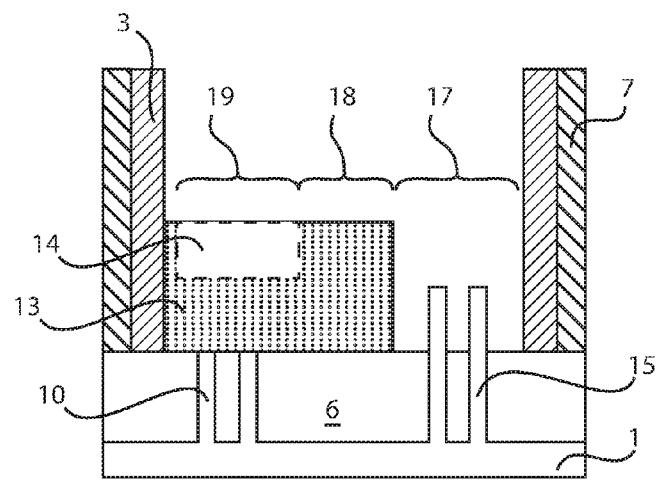
FIG. 8D is a side cross-sectional view of the structure depicted in FIG. 8A along the length of the gate structure.

FIGS. 7A-7D depict removing at least the first work function metal 13 from the second functional gate opening 12 to the p-type fin structure 15 in the p-type FinFET region. The first work function metal 13 may be removed using an etch process, such as a selective etch process. In one embodiment, the etch process for removing the first work function metal layer 13 is selective to the block mask 16, and the at least one gate dielectric (not shown) that is underlying the first work function metal 13. In some embodiments, the at least one gate dielectric may also be removed at this stage of the method using an etch process. The etch process for removing the first work function metal layer 13 may include reactive ion etch (RIE), plasma etching, ion beam etching or laser ablation/etching. Removing the first work function metal layer 13 provides a second functional gate structure opening 17 to the p-type fin structure 15, as depicted in FIGS. 7C and 7D.

FIGS. 8A-8D depict removing the block mask 16. The block mask 16 may be removed using an etch process that is selective to the first work function metal 13 and the at least one gate dielectric (not shown). In the embodiments, in which that least one gate dielectric has been removed from the p-type fin structure 15, the etch process for removing the block mask can be selective to the p-type fin structure 15. The etch process may be a wet chemical etch, plasma etch or reactive ion etch. Removing the block mask 16 produces an isolation gate opening 18 to the remaining portion of the first work function metal 13 that is present over the isolation region. Removing the block mask 16 produces a first functional gate structure opening 19 present over the n-type fin structure 10. FIGS. 9A-9D depict forming a second work function metal (or just bulk W gate metal if another WFM on PFET is not required for devices) 20 in at least the second functional gate opening 19 to the p-type fin structure 15 that is present in the p-type FinFET region. In some embodiments, the layer identified by reference number 20 is a combination of a work function metal, e.g., second work function metal, in combination with a bulk gate metal, such as tungsten.

In the embodiments, in which the at least one gate dielectric has been removed from the p-type fin structure 15, a newly deposited at least one gate dielectric may be formed on the p-type fin structure 15 prior to forming the second work function metal layer 20. The second work function metal layer 20 may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

The second work function metal 20 may be formed by using a deposition method, such as a chemical vapor deposition method and/or a physical vapor deposition (PVD). For example, when the first work functional metal 20 is deposited using a PVD method, the method employed may include plating, electroplating, plating, sputter, and a combination thereof. For example, when the first work function metal 20 is deposited using chemical vapor deposition (CVD), the first work function metal 20 may be deposited using atomic layer deposition (ALD), plasma enhanced chemical vapor deposition (PECVD), metal organic chemical vapor deposition (MOCVD) and a combination thereof.

In some embodiments, the second work function metal 20, i.e., p-type work function metal, may be deposited directly atop the at least one gate dielectric that is present on the p-type fin structure 15 in the second functional gate opening 17, as depicted in FIG. 9C. The second work function metal 20 may also be present atop a remaining portion of the first work function metal layer 13 that is present over the isolation region 6 within the gate isolation opening 18, as depicted in FIG. 9B. The second work function metal layer 20 may also be present atop the remaining portion of the first work function metal layer 13 that is present on the n-type fin structure 10 in the first functional gate opening 19, as depicted in FIG. 9A. The second work function metal layer 20 that is present in the first functional gate opening 19, the isolation gate region opening 18 and the second functional gate opening 17 may be contiguous and continuous portions.

Referring to FIG. 9A, a void 19 may be encapsulated below the second work function metal layer 20 in the first functional gate opening 19. The isolation gate opening 10 may be entirely free of voids, as the isolation gate opening 10 may be entirely filled with the at least one gate dielectric (optional), the first work function metal layer 13, and the second work function metal layer 20 (or just bulk W gate metal if the second pFET work function metal is not required). Referring to FIG. 9D, the portions of the second work function metal layer 20 that are present in the first functional gate opening 19, the isolation gate opening 18 and the second functional gate opening 17 may be contiguous and continuous.

FIGS. 9A-9D also depicts forming a self-aligned contact cap 21 atop the second work function metal layer 20. The self-aligned contact cap (SAC) 21 is typically composed of a dielectric, such as silicon nitride, and may be used to prevent gate to contact shorting when patterning gate conductor contacts and/or source and drain trench contact vias into the ILD to contact the epitaxial material used for the source and drain regions. The self-aligned contact cap 21 may be formed using a deposition process, such as chemical vapor deposition (CVD).

The gate electrode contact (not show) can be formed of one of aluminum, titanium, copper, silver, gold or alloys thereof after etching through the SAC cap 21 in the "middle of line" contact module, this is completed after source/drain contact etching and metallization. The gate electrode contact may be deposited using physical vapor deposition or chemical vapor deposition.

FIGS. 9A-9D depict one embodiment of a semiconductor device comprising a first fin structure, i.e., n-type fin structure 10, in a first portion of a substrate 1, and a second fin structure, i.e., p-type fin structure 15, in a second portion of the substrate 1. The first portion of the substrate 1 is separated from the second portion of the substrate 1 by at least one isolation region 6. A functional gate structure 25 extends from the first fin structure, i.e., n-type fin structure 10, across the isolation region 6 to the second fin structure, i.e., p-type fin structure 15. The "functional gate structure" operates to switch the semiconductor device from an "on" to "off" state, and vice versa.

Referring to FIG. 9A, the functional gate structure 25 may include a portion on the first fin structure, i.e., an n-type fin structure 10, including a first work function metal 13, i.e., n-type work function metal, having at least one void 14. The first work functional metal 13 may be directly on at least one gate dielectric that is present on an n-type fin structure 15. A second work function metal 20 may be present atop the first work function metal 13 over the n-type fin structure 10, as well as a gate electrode formed after SAC cap (21) RIE. The sidewalls of the stack of the at least one gate dielectric, the first work function metal 13 and the second work function metal 20 (which may also be a second work function metal in combination with a bulk W, or just bulk W gate metal) that is present on the channel portion of the n-type fin structure 10 are substantially perpendicular to the upper surface of the n-type fin structure 10, as depicted in FIG. 9A.

Referring to FIG. 9B, the functional gate structure 25 may also include a portion that is present over the isolation region 6 that includes at least one gate dielectric, the first work function metal 13 and a second work function metal 20 (which may also be a second work function metal in combination with a bulk W, or just bulk W gate metal). The portion of the functional gate structure 25 that is present over the isolation region 6 is entirely free of voids, i.e., a void is not present in at least the portion of the first work function metal 13 and the second work function metal 20 that is present over the isolation region 6. The base of the portion of the functional gate structure 25 that is present over the isolation region 6 has a greater dimension than the upper surface of the functional gate structure 25 that is present over the isolation region 6, as depicted in FIG. 9B. This geometry results from the etch process for forming the isolation gate opening 8 described above with reference to FIGS. 3B and 3D.

Still referring to FIG. 9C, the functional gate structure 25 may also include a portion on the second fin structure, i.e., p-type fin structure 15, including a second work function metal 20, i.e., a p-type work function metal. The second work functional metal 20 may be directly on at least one gate dielectric that is present on the p-type fin structure 20. A gate electrode contact 21 may be present atop the second work function metal 20. The sidewalls of the stack of the at least one gate dielectric and the second work function metal 20 that is present on the channel portion of the p-type fin structure 20 are substantially perpendicular to the upper surface of the p-type fin structure 20, as depicted in FIG. 9C.

N-type source and drain regions may be present on the source and drain region portions of the n-type fin structure 10 on opposing sides of the functional gate structure 25. P-type source and drain regions may be present on the source and drain region portions of the p-type fin structure 15 on opposing sides of the functional gate structure 25.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   forming a replacement gate structure in contact with a first device channel and a second device channel, wherein the replacement gate structure includes a sacrificial gate conductor and a dielectric cap layer that includes a bump portion between the first and second semiconductor device channel;
   removing the bump portion of the dielectric cap layer and the underlying portion of the sacrificial gate conductor to provide an isolation gate opening having a first width between the first and second device channels;
   removing the portion of the replacement gate structure over the first and second device channels to provide functional gate openings having a second gate width that is less than the first gate width; and
   forming a first and second functional gate structure in the functional gate openings to the first and second semiconductor device channels.

2. The method of claim 1, wherein the first device channel is provided by a first fin structure and the second device channel is provided by a second fin structure.

3. The method of claim 2, wherein the first fin structure is separated from the second fin structure by an isolation region, wherein said isolation gate opening is formed over the isolation region.

4. The method of claim 2, further comprising forming an interlevel dielectric layer having an upper surface coplanar with an upper surface of the bump portion.

5. The method of claim 4, wherein the dielectric cap layer is present on sidewalls of the portion of the sacrificial gate conductor that is present on the isolation region and extends to the bump portion of the dielectric cap layer that is present on the upper surface of the sacrificial gate conductor.

6. The method of claim 5, wherein the removing of the bump portion of the dielectric cap layer and the underlying portion of the sacrificial gate conductor to provide an isolation gate opening having a first width between the first and second device channels comprises:
   removing the bump portion of the dielectric cap layer with an anisotropic etch that is selective to at least the isolation gate structure; and
   removing the underlying portion of the sacrificial gate conductor with an etch process that tapers an inside sidewall of the dielectric cap layer that is present on sidewalls of the portion of the sacrificial gate conductor.

7. The method of claim 6, wherein a portion of the dielectric cap layer that is present on the sacrificial gate conductor over the first fin structure and the second fin structure has a lesser height than a height of the bump portion of the dielectric cap layer prior to being removed.

8. The method of claim 7, wherein said removing the portion of the replacement gate structure over the first and second device channels to provide functional gate openings having a second gate width that is less than the first gate width comprises:
   forming amorphous semiconductor material in the isolation gate opening;
   planarizing the interlevel dielectric layer to remove an upper portion of the dielectric cap layer to expose the portion of the sacrificial gate conductor that is present over the first fin structure and the second fin structure; and
   removing the sacrificial gate conductor over the first fin structure and the second fin structure with an etch that is selective to a remaining portion of the dielectric cap layer that is present contacting sidewalls of the sacrificial gate conductor over the first fin structure and the second fin structure, and the amorphous semiconductor material in the isolation gate opening.

9. The method of claim 8, wherein forming the first and second functional gate structure in the functional gate openings to the first and second semiconductor device channels comprises:
   removing the amorphous semiconductor material in the isolation gate opening;

forming a gate dielectric in the isolation gate opening, the first functional gate opening and the second functional gate opening;

forming a first work function metal in the isolation gate opening, the first functional gate opening and the second functional gate opening;

forming a block mask filling at least a portion of the first functional gate opening, and completely filling the isolation gate opening;

removing exposed portions of at least the first work function metal in the second functioning gate opening; and forming a second work function metal in at least the second functional gate opening.

10. A method of forming a semiconductor device comprising:

forming a replacement gate structure in contact with a first fin structure and a second fin structure that are present on a semiconductor substrate and separated by an isolation region, wherein the replacement gate structure includes a sacrificial gate conductor and a dielectric cap layer that includes a bump portion overlying the isolation region between the first and second fin structures;

removing the bump portion of the dielectric cap layer and the underlying portion of the sacrificial gate conductor to provide an isolation gate opening having a first width between the first and second fin structures;

removing the portion of the replacement gate structure over the first and second fin structures to provide functional gate openings having a second gate width that is less than the first gate width; and forming a first and second functional gate structure in the functional gate openings to the first and second fin structures.

11. The method of claim 10, further comprising forming an interlevel dielectric layer having an upper surface coplanar with an upper surface of the bump portion.

12. The method of claim 11, wherein the dielectric cap layer is present on sidewalls of the portion of the sacrificial gate conductor that is present on the isolation region and extends to the bump portion of the dielectric cap layer that is present on the upper surface of the sacrificial gate conductor.

13. The method of claim 12, wherein the removing of the bump portion of the dielectric cap layer and the underlying portion of the sacrificial gate conductor to provide an isolation gate opening having a first width between the first and second device channels comprises:

removing the bump portion of the dielectric cap layer with an anisotropic etch that is selective to at least the isolation gate structure; and removing the underlying portion of the sacrificial gate conductor with an etch process that tapers an inside sidewall of the dielectric cap layer that is present on sidewalls of the portion of the sacrificial gate conductor.

14. The method of claim 13, wherein a portion of the dielectric cap layer that is present on the sacrificial gate conductor over the first fin structure and the second fin structure has a lesser height than a height of the bump portion of the dielectric cap layer prior to being removed.

15. The method of claim 14, wherein said removing the portion of the replacement gate structure over the first and second device channels to provide functional gate openings having a second gate width that is less than the first gate width comprises:

forming amorphous semiconductor material in the isolation gate opening;

planarizing the interlevel dielectric layer to remove an upper portion of the dielectric cap layer to expose the portion of the sacrificial gate conductor that is present over the first fin structure and the second fin structure; and removing the sacrificial gate conductor over the first fin structure and the second fin structure with an etch that is selective to a remaining portion of the dielectric cap layer that is present contacting sidewalls of the sacrificial gate conductor over the first fin structure and the second fin structure, and the amorphous semiconductor material in the isolation gate opening.

16. The method of claim 15, wherein forming the first and second functional gate structure in the functional gate openings to the first and second semiconductor device channels comprises:

removing the amorphous semiconductor material in the isolation gate opening;

forming a gate dielectric in the isolation gate opening, the first functional gate opening and the second functional gate opening;

forming a first work function metal in the isolation gate opening, the first functional gate opening and the second functional gate opening;

forming a block mask filling at least a portion of the first functional gate opening, and completely filling the isolation gate opening;

removing exposed portions of at least the first work function metal in the second functioning gate opening; and forming a second work function metal in at least the second functional gate opening.

17. The method of claim 16 further comprising removing the block mask prior to forming the second work function metal.

* * * * *